(12) United States Patent
Ogatsu et al.

(10) Patent No.: US 8,995,135 B2
(45) Date of Patent: Mar. 31, 2015

(54) ELECTRONIC DEVICE AND A CASING USED THEREFOR

(75) Inventors: Toshinobu Ogatsu, Tokyo (JP); Shinichi Kamiya, Shizuoka (JP)

(73) Assignee: NEC Corporation, Tokyo (JP)

( * ) Notice: Subject to any disclaimer, the term of this patent is extended or adjusted under 35 U.S.C. 154(b) by 329 days.

(21) Appl. No.: 11/996,843

(22) PCT Filed: Jul. 27, 2006

(86) PCT No.: PCT/JP2006/315345
§ 371 (c)(1),
(2), (4) Date: May 15, 2008

(87) PCT Pub. No.: WO2007/013672
PCT Pub. Date: Feb. 1, 2007

(65) Prior Publication Data
US 2010/0142156 A1    Jun. 10, 2010

(30) Foreign Application Priority Data
Jul. 27, 2005 (JP) ................................. 2005-217292

(51) Int. Cl.
| | |
|---|---|
| H05K 5/00 | (2006.01) |
| H05K 7/00 | (2006.01) |
| A47B 96/06 | (2006.01) |
| H05K 5/02 | (2006.01) |

(52) U.S. Cl.
CPC .................. H05K 5/0217 (2013.01)
USPC ...... 361/724; 361/725; 361/726; 361/679.02; 361/679.03; 361/679.26; 361/679.27; 292/341.17

(58) Field of Classification Search
USPC ............. 361/679.01, 679.02, 679.55–679.59, 361/724–726; 340/384.71, 566; 174/32, 15; 29/557; 455/575.1, 575.3, 575.4, 455/575.8, 325, 556.1, 550.1, 90.1, 567, 455/58; 369/282, 291, 253, 44.16, 75.5
See application file for complete search history.

(56) References Cited

U.S. PATENT DOCUMENTS

| | | | |
|---|---|---|---|
| 5,580,182 A * | 12/1996 | Lin ............................... 403/325 |
| 7,202,431 B2 * | 4/2007 | Gauzin ......................... 200/339 |
| 2001/0015885 A1 | 8/2001 | Nakajima et al. | |
| 2002/0186530 A1 * | 12/2002 | Nakajima et al. ............. 361/683 |
| 2003/0022633 A1 * | 1/2003 | Chen ................................ 455/90 |
| 2003/0043535 A1 | 3/2003 | Wang et al. | |

(Continued)

FOREIGN PATENT DOCUMENTS

| | | |
|---|---|---|
| CN | 2562222 Y | 7/2003 |
| CN | 1599378 A | 3/2005 |

(Continued)

OTHER PUBLICATIONS

Translation of the Japanese Office Action mailed Jul. 11, 2012.

Primary Examiner — Jerry Wu
(74) Attorney, Agent, or Firm — Dickstein Shapiro LLP

(57) ABSTRACT

In an electronic device in which a component connecting portion is mounted inside a case (1, 2), a protective cover (5) is mounted to the case to be rotatable and covers the component connecting portion. The protective cover has elastically deformable hooks (52) facing a direction (A1) parallel to a rotation center line thereof. On the other hand, the case has hook receivers (11a) engageable with and disengageable from the hooks. The protective cover may be removable from the case or may be loosely connected thereto.

28 Claims, 7 Drawing Sheets

(56) References Cited

U.S. PATENT DOCUMENTS

| | | | |
|---|---|---|---|
| 2004/0063457 A1* | 4/2004 | Kim et al. | 455/550.1 |
| 2004/0102230 A1* | 5/2004 | Nuovo | 455/575.1 |
| 2004/0192418 A1* | 9/2004 | Nam | 455/575.1 |
| 2004/0198243 A1* | 10/2004 | Tasy et al. | 455/90.1 |

FOREIGN PATENT DOCUMENTS

| | | |
|---|---|---|
| JP | S54-184427 U | 12/1979 |
| JP | H04-85656 U | 7/1992 |
| JP | 7-7179 | 1/1995 |
| JP | 09-018167 A | 1/1997 |
| JP | 10-045152 A | 2/1998 |
| JP | 10-162796 A | 6/1998 |
| JP | 11-237930 | 8/1999 |
| JP | 2000228586 A | 8/2000 |
| JP | 2001118554 A | 4/2001 |
| JP | 2002-118634 | 4/2002 |
| JP | 2003-218549 | 7/2003 |
| JP | 2004-031656 A | 1/2004 |
| JP | 2004-127996 | 4/2004 |
| JP | 2004-146618 A | 5/2004 |
| JP | 2004-214969 | 7/2004 |

* cited by examiner

ELECTRONIC DEVICE AND A CASING USED THEREFOR

TECHNICAL FIELD

This invention relates to an electronic device, such as a digital camera or a portable music player.

BACKGROUND ART

In an electronic device, such as a digital camera or a portable music player, a memory card is used. In recent years, the memory card is also used in some mobile phones. In order to enable the use of the memory card, the electronic device has a memory card connector mounted therein. The memory card connector is covered by a protective cover. When the memory card is inserted into or removed from the memory card connector, the protective cover is opened.

The electronic device of this type having the protective cover is disclosed in, for example, Japanese Unexamined Patent Application Publication (JP-A) No. 2003-218549. Referring to FIG. 1, the electronic device will briefly be described.

The electronic device includes an upper case 1, a lower case 2, and a protective cover 5. In a space between the upper case 1 and the lower case 2, a panel 3 is provided and a memory card connector (not shown) is mounted on the panel 3. A memory card (not shown) can be inserted into or removed from the memory card connector.

The protective cover 5 has a rectangular shape in plan view and a generally L shape in section. The protective cover 5 has insertion ribs 51 formed on both ends of a long side edge and generally L-shaped hooks 54 formed in the vicinity of both ends of short side edges.

The upper case 1 has hook receivers 14 formed inside one long side in correspondence to the hooks 54 of the protective cover 5, respectively. Between the hooks 54 and an inner upper end of the lower case 2, a space S is formed.

When the protective cover 5 is opened, an operation is performed as follows. First, a concave portion (not shown) formed on a right side surface of the protective cover 5 in FIG. 1 is pulled up by a finger. Consequently, the hooks 54 are disengaged from the hooks 14 of the upper case 1, respectively, and elastically deformed leftwards within a range of the space S. Subsequently, the protective cover 5 is rotated around the insertion ribs 51 in a direction shown by an arrow. Accordingly, the protective cover 5 is opened, so that the memory card can be inserted into or removed from the memory card connector on the panel 3.

In the above-mentioned electronic device, the hooks 54 of the protective cover 5 are elastically deformed in a direction perpendicular to a rotation center line (a line connecting the both insertion ribs 51) of the protective cover 5, so that the protective cover 5 is easy to be unintentionally opened from the upper case 1 when touched by hand.

In order to prevent the protective cover 5 from being unintentionally opened from the upper case 1, it is inevitable to deepen a depth of engagement between the hooks 54 of the protective cover 5 and the hooks 14 of the upper case 1. In this event, the space S in FIG. 7 must be widened so that the upper case 1 and the lower case 2 are increased in size in a left-to-right [transversal] direction in FIG. 7. Thus, the electronic device itself is increased in size.

DISCLOSURE OF THE INVENTION

It is therefore an object of the present invention to provide an electronic device capable of preventing a protective cover from being unintentionally opened from a case and capable of achieving reduction in size.

It is another object of the present invention to provide a casing for use in the above-mentioned electronic device.

According to an aspect of the present invention, there is provided an electronic device characterized by including a case, a component connecting portion mounted inside the case, and a protective cover mounted to the case to be rotatable around a rotation center line and covering the component connecting portion, the protective cover having an elastically deformable hook facing a direction parallel to the rotation center line, the case having a hook receiver engageable with and disengageable from the hook.

The electronic device may be arranged so that the case includes an upper case and a lower case coupled with the upper case, the protective cover and the hook receiver being disposed on the upper case.

The electronic device may be arranged so that the case includes an upper case and a lower case coupled with the upper case, the protective cover being disposed on the upper case, the hook receiver being disposed on the lower case.

The electronic device may be arranged so that the electronic device further including a panel arranged inside the case, the component connecting portion being mounted on the panel.

The electronic device may be arranged so that the protective cover has an additional hook facing a direction reverse to the hooks, the case having an additional hook receiver engageable with and disengageable from the additional hook.

The electronic device may be arranged so that the case has an edge portion formed on its upper surface and defining a cover receiving opening, the protective cover being mounted so as to be fitted to the cover receiving opening.

The electronic device may be arranged so that the case has a flange formed on the edge portion, the protective cover being supported by the flange.

The electronic device may be arranged so that the component connecting portion is a connector for connecting a memory card.

The electronic device may be arranged so that the component connecting portion is a connector for connecting an SIM card.

The electronic device may be arranged so that the component connecting portion is a contact point for connecting an exchangeable battery.

According to another aspect of the present invention, there is provided a casing for an electronic device, characterized by including a case incorporating a component connecting portion and a protective cover mounted to the case to be rotatable around a rotation center line and covering the component connecting portion, the protective cover having an elastically deformable hook facing a direction parallel to the rotation center line, the case having a hook receiver engageable with and disengageable from the hook.

The casing may be arranged so that the case includes an upper case and a lower case coupled with the upper case, the protective cover and the hook receiver being disposed on the upper case.

The casing may be arranged so that the case includes an upper case and a lower case coupled with the upper case, the protective cover being disposed on the upper case, the hook receiver being disposed on the lower case.

The casing may be arranged so as to further include a panel arranged inside the case, the component connecting portion being mounted on the panel.

The casing may be arranged so that the protective cover has an additional hook facing a direction reverse to the hooks, the case having an additional hook receiver engageable with and disengageable from the additional hook.

The casing may be arranged so that the case has an edge portion formed on its upper surface and defining a cover receiving opening, the protective cover being mounted so as to be fitted to the cover receiving opening.

The casing may be arranged so that the case has a flange formed on the edge portion, the protective cover being supported by the flange.

The casing may be arranged so that the component connecting portion is a connector for connecting a memory card.

The casing may be arranged so that the component connecting portion is a connector for connecting an SIM card.

The casing may be arranged so that the component connecting portion is a contact point for connecting an exchangeable battery.

BEST MODE FOR CARRYING OUT THE INVENTION

Figure 1:
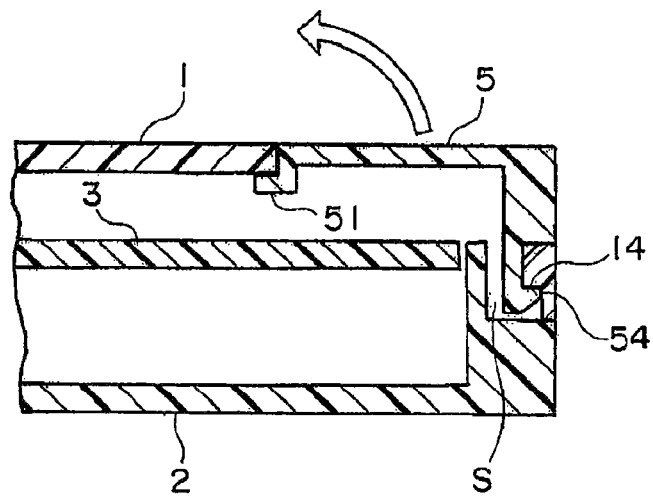
FIG. 1 is a sectional view of a characteristic part of a conventional electronic device.

Referring to FIGS. 2 through 6, an electronic device according to a first embodiment of the present invention will be described.

In FIGS. 2 through 6, the electronic device includes a case including an upper case 1 and a lower case 2 coupled thereto. The upper case 1 is provided with a protective cover 5. Inside the case, a circuit board or a panel 3 is provided between the upper case 1 and the lower case 2. Herein, a combination of the upper case 1, the lower case 2, the panel 3, and the protective cover 5 is called a casing for an electronic device.

On an upper surface of the panel 3, a memory card connector 31 is mounted as a component connecting portion. A memory card 4 can be inserted into or removed from the memory card connector 31. Inside the case, in addition to the memory card 4, an internal mechanism (not shown in the figure) for a mobile phone, a digital camera, or a portable music player is provided by the use of the panel 3 or the like.

In plan view, the protective cover 5 has a rectangular shape extended in a first direction (left-to-right direction) A1 and in a second direction (back-and-forth direction) A2 perpendicular to the first direction. The protective cover 5 has a generally L-shaped section along a plane perpendicular to the first direction A. The protective cover 5 has, at an end portion in the second direction A2, i.e., at a rear end, a pair of insertion ribs 51 separated from each other in the first direction A1. Further, the protective cover 5 has, at its front end, a pair of hooks 52 separated from each other in the first direction A1. As apparent from FIG. 5, both of the hooks 52 are formed to face outward in the first direction A1. In addition, the protective cover 5 is provided with a concave portion 53 at the center of the front end.

The upper case 1 has an edge portion 1a defining a cover receiving opening 12 which has a shape substantially congruent with that of the protective cover 5. The cover receiving opening 12 extends from an upper surface to a front surface of the upper case 1. The edge portion 1a is provided with a flange 13 formed at its rear side. The protective cover 5 is mounted so as to be fitted to the cover receiving opening 12. In this event, the protective cover 5 is supported by the flange 13 to be prevented from dropping into the case through the cover receiving opening 12.

The edge portion 1a of the upper case 1 has, at its front side, hook holes 11 separated from each other in the first direction A1 and formed in one-to-one correspondence to the hooks 52. Each of the hook holes 11 is provided with a hook receiver 11a formed at its inner part. The hook receivers 11a are formed to face inward in the first direction A1 so as to be engaged with the hooks 52, respectively.

Figure 2:
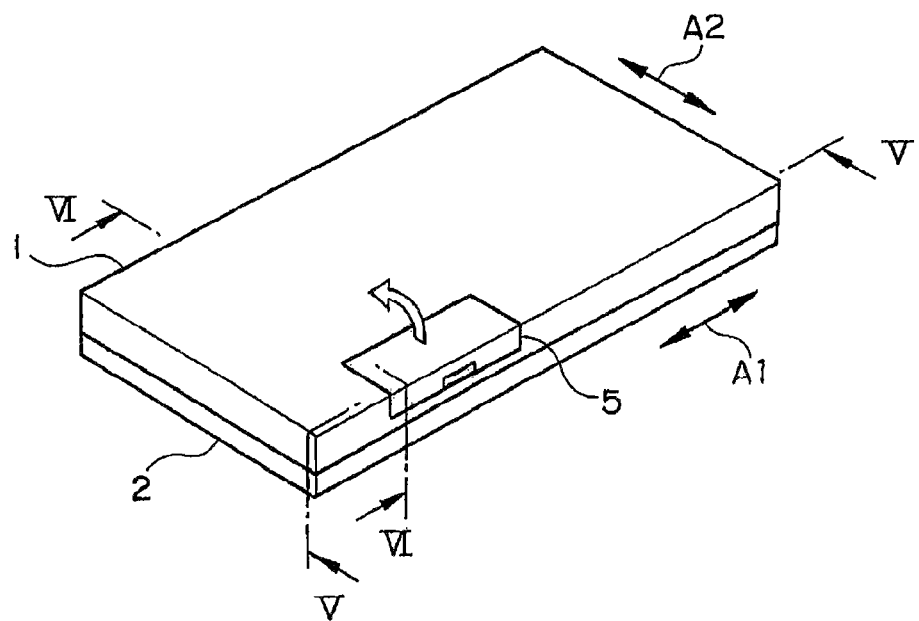
FIG. 2 is a perspective view of an electronic device according to a first embodiment of the present invention.
Figure 3:
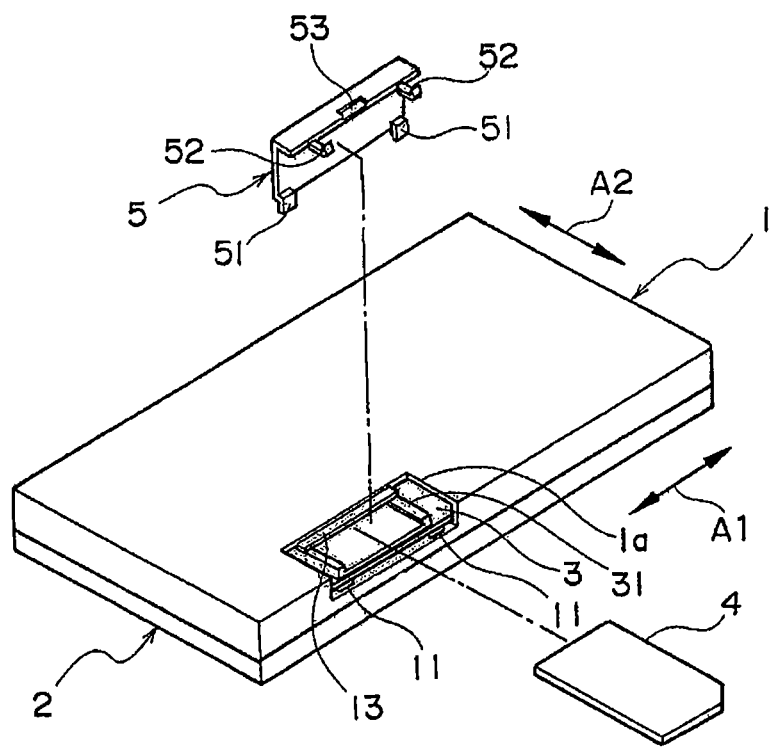
FIG. 3 is a perspective view of the electronic device together with a memory card in a state where a protective cover is removed therefrom.
Figure 4:
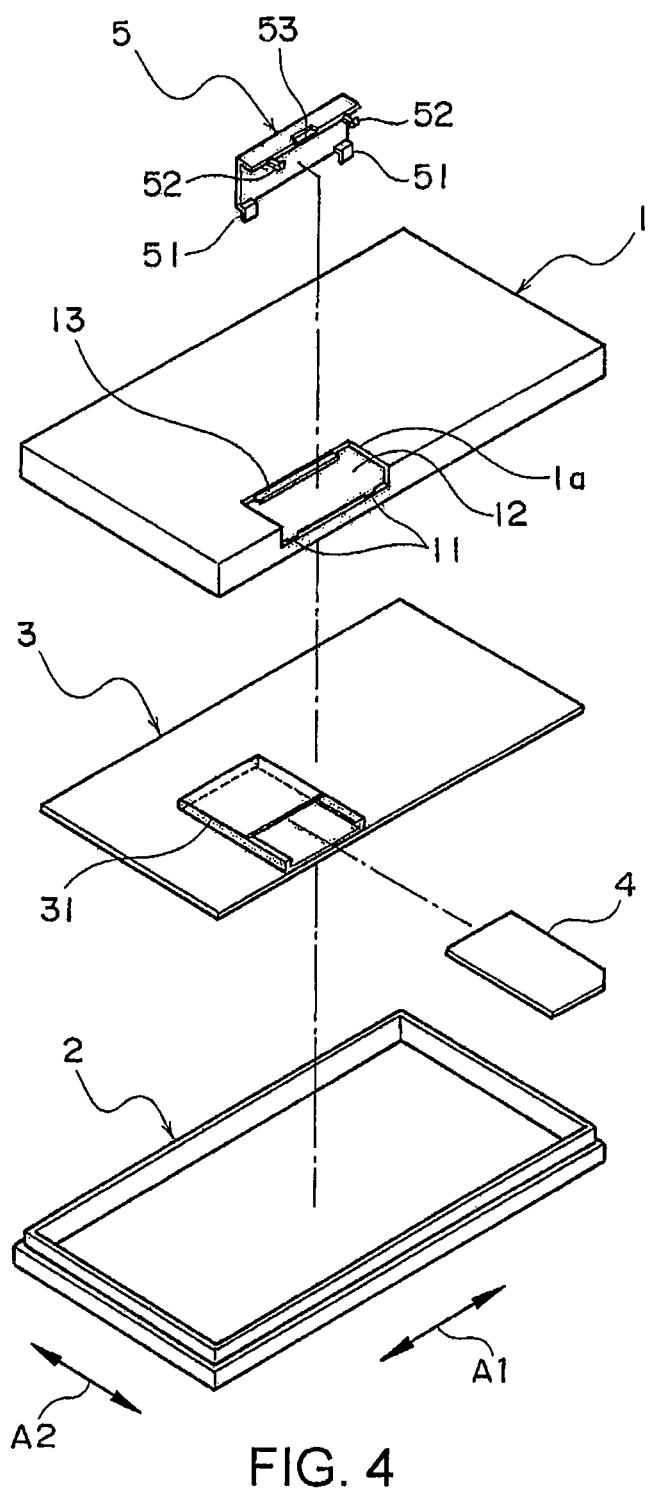
FIG. 4 is an exploded perspective view of the electronic device together with the memory card.

The memory card 4 in a state shown in FIG. 3 is inserted into the memory card connector 31. Next, the insertion ribs 51 of the protective cover 5 are engaged with an inner surface of a rear part of the edge portion 1a of the upper case 1. Subsequently, the protective cover 5 is rotated rightward around the insertion ribs 51 by approximately 90 degrees toward a position shown in FIG. 2 to close the protective cover 5. In this event, a straight line connecting the insertion ribs 51 is a rotation center line of the protective cover 5. Therefore, this rotation center line extends in the first direction A1.

Figure 5:
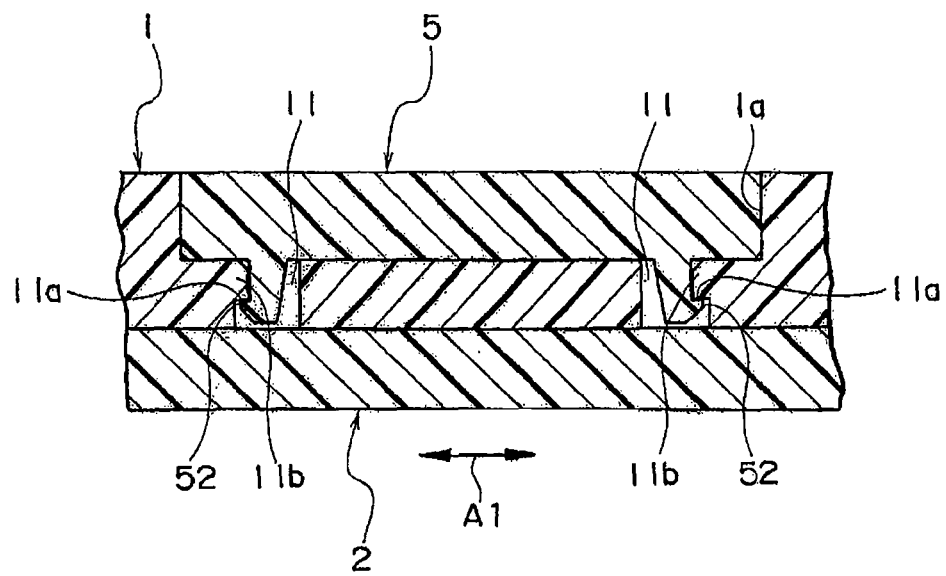
FIG. 5 is a sectional view taken along a line V-V in FIG. 2.
Figure 6:
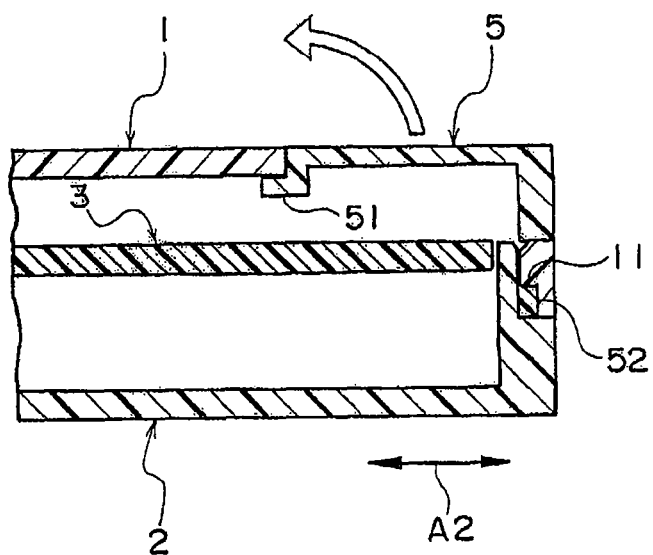
FIG. 6 is a sectional view taken along a line VI-VI in FIG. 2.

When the protective cover 5 is closed, the hooks 52 of the protective cover 5 are inserted into the hook holes 11 of the upper case 1, respectively. Eventually, as shown in FIGS. 5 and 6, the hooks 52 of the protective cover 5 are slightly bent inward in the first direction A1 and go over convex portions 11b to be engaged with the hook receivers 11a, respectively. Thus, as shown in FIG. 2, the protective cover 5 in a closed state is firmly retained by the upper case 1.

In case where the protective cover 5 is opened from the state of FIG. 2, an operation is performed as follows. The concave portion 53 of the protective cover 5 is pulled up by a finger engaged therewith. Then, the hooks 52 of the protective cover 5 are disengaged from the hook receivers 11a of the upper case 1, respectively. Therefore, the protective cover 5 can easily be opened.

Figure 7:
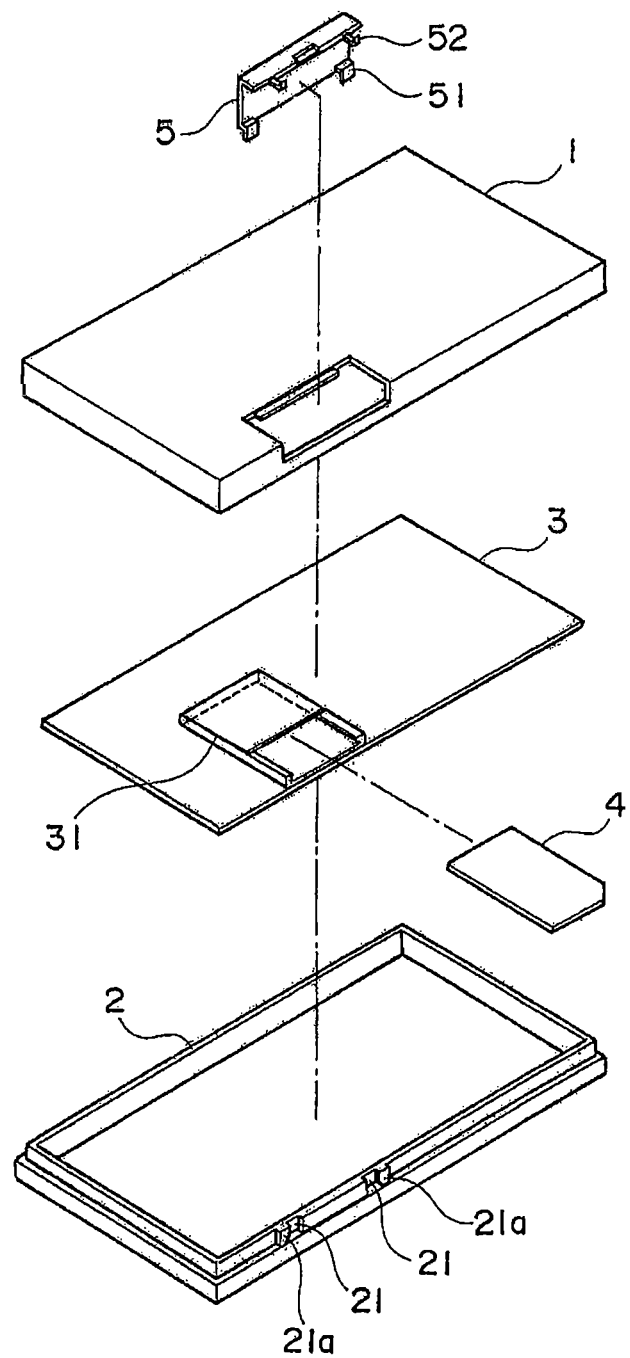
FIG. 7 is an exploded perspective view of an electronic device, together with a memory card, according to a second embodiment of the present invention.

Referring to FIG. 7, an electronic device according to a second embodiment of the present invention will be described. Similar portions are designated by the like reference numerals and description thereof is omitted.

The upper case 1 shown in FIG. 7 does not have those components corresponding to the hook holes 11 and the hook receivers 11a of the electronic device shown in FIGS. 2 through 6. Instead, on a front surface of the lower case 2, a pair of hook grooves 21 separated from each other in the first direction A1 and hook receivers 21a formed outside thereof and projecting forward are formed. As a matter of course, each set of the hook groove 21 and the hook receiver 21 is disposed in correspondence to each of the hooks 52 of the protective cover 5.

In this electronic device, when the protective cover 5 is closed, the hooks 52 of the protective cover 5 are inserted into the hook grooves 21 of the lower case 2, respectively. The hooks 52 of the protective cover 5 are engaged with the hook receivers 21a in a vertical direction with slight inward bend in the first direction A1. Thus, the protective cover 5 in a closed state is firmly retained by the case. Incidentally, an operation of opening the protective cover 5 is carried out in a manner similar to the electronic device shown in FIGS. 2 through 6.

According to the electronic device in FIG. 7, the cover receiving opening 12 of the upper case 1 has a simplified structure. Further, a molding die used in manufacturing the upper case 1 can be simplified.

In the electronic device shown in FIG. 3 or 7, the protective cover 5 can be completely separated from the upper case 1. However, for the sake of usability, the protective cover 5 may be loosely connected to the upper case 1 by a rubber component or the like.

Figure 8:
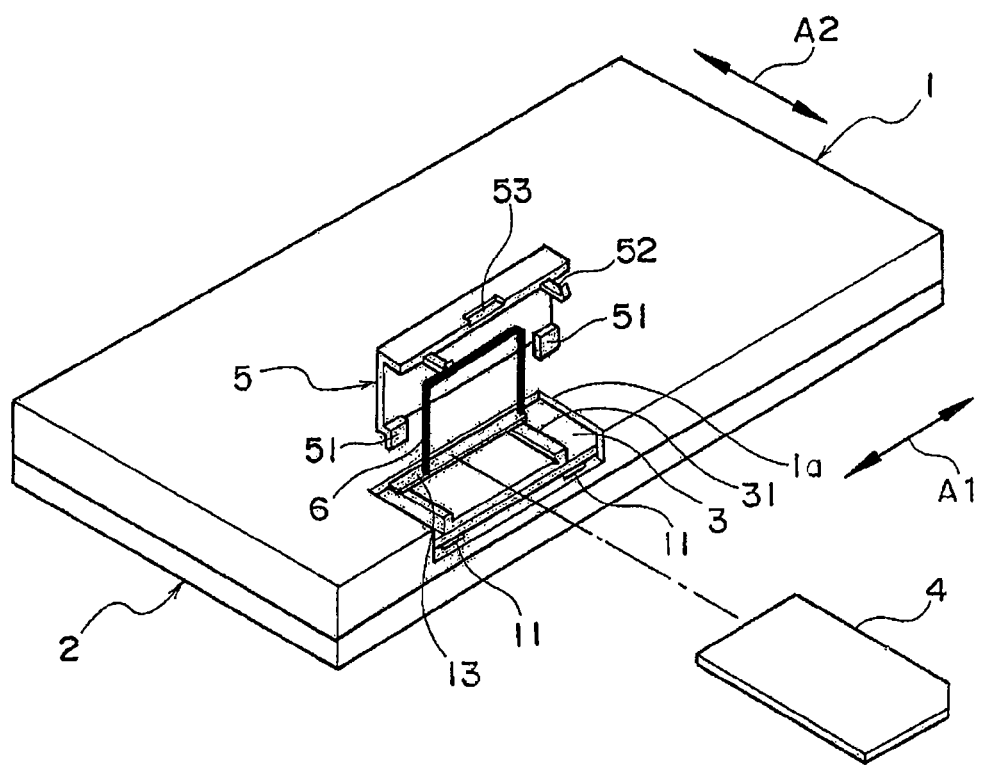
FIG. 8 is a perspective view of an electronic device, together with a memory card, according to a third embodiment of the present invention in a state where a protective cover is removed therefrom.
Figure 9:
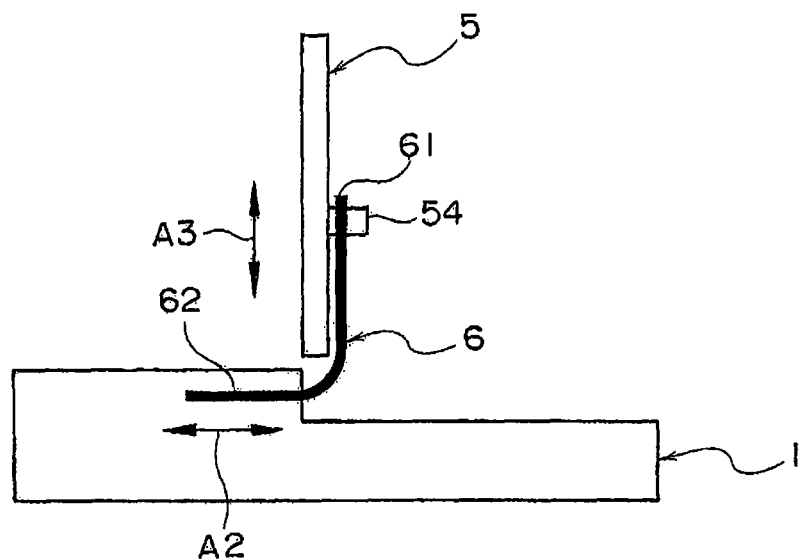
FIG. 9 is a schematic side view showing a state where the protective cover is opened.
Figure 10:
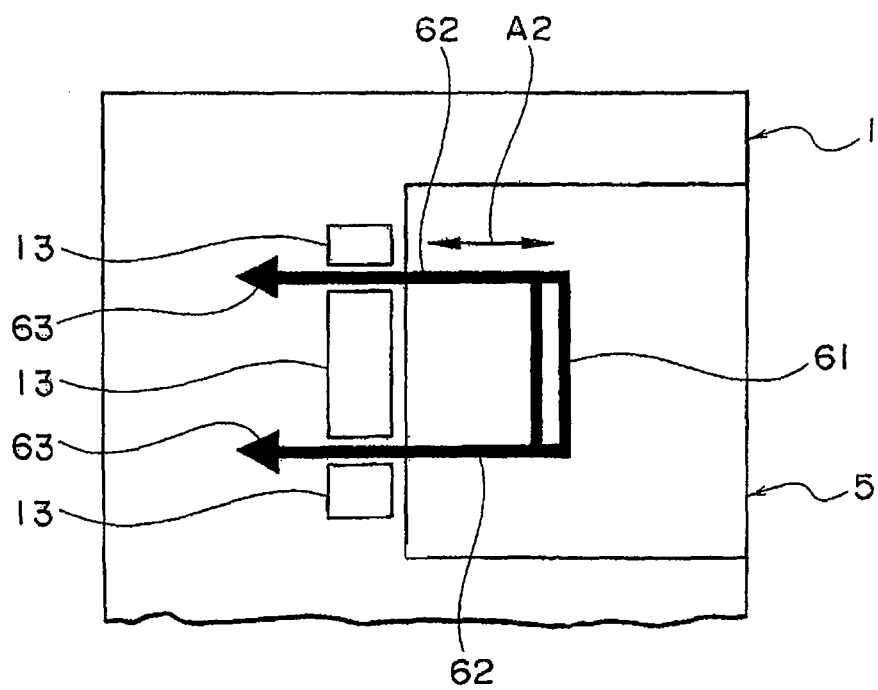
FIG. 10 is a schematic bottom view of an upper cover showing a state where the protective cover is closed.

Referring to FIGS. 8 through 10, an electronic device according to a third embodiment of the present invention will be described. Similar components are designated by the same reference numerals and description thereof is omitted.

In the electronic device shown in FIGS. 8 through 10, the protective cover 5 is connected to the upper case 1 by a connecting member 6 made of rubber having flexibility. Therefore, in this case, it may be said that the protective cover 5 is an openable/closable cover.

The upper case 1 has a stopper portion 13 formed on a lower surface thereof. The protective cover 5 has a projection 54 formed on a lower surface thereof. The connecting member 6 generally has a U shape and includes a fixed portion 61 fixed to the projection 54 of the protective cover 5 and a pair of leg portions 62 extending in parallel with each other from the fixed portion 61. Each of the leg portions 62 has an engaging portion 63 to be engaged with the stopper portion 13 of the upper case 1 in the first direction A2. Thus, disengagement of the protective cover 5 from the upper case 1 is prevented. In a state where the protective cover 5 is normally mounted to the upper case 1, the engaging portions 63 are preferably separated from the stopper portion 13.

The hooks 52 are released from the upper case 1 and the protective cover 5 is slightly moved forward in the second direction A2 and raised along a third direction (vertical direction) A3 perpendicular to the first direction A1 and the second direction A2. Consequently, the protective cover 5 can easily be opened. Incidentally, an operation of closing the protective cover 5 is carried out in a manner similar to the electronic device shown in FIGS. 2 through 6.

According to the electronic device shown in FIGS. 8 through 10, the protective cover 5 is connected to the upper case 1 in a relatively loose state to be prevented from disengagement. Therefore, upon opening and closing the protective cover 5, usability is good.

Each of the above-mentioned electronic devices has two sets of combination of the hook and the hook receiver but may be modified into a configuration with only one set. Further, in the foregoing, the case of using the memory card has been described. However, not being limited to the memory card, this invention is also applicable to a case where an SIM card or an exchangeable battery is used. In case where the SIM card is used, an SIM card connector is used as the component connecting portion. In case where the exchangeable battery is used, a contact point for connecting the battery is used as the component connecting portion.

INDUSTRIAL APPLICABILITY

In order to realize easy insertion and removal of the memory card, the SIM card, or the exchangeable battery, a complicated lock mechanism using a spring is often used. However, by employing the present invention, the above-mentioned mechanism is unnecessary and reliability of the electronic device can be achieved by inexpensive alternative means.

The invention claimed is:

1. An electronic device including a case having an outer wall having an opening, a component connecting portion mounted inside the case, and a protective cover mounted to the case to be rotatable around a rotation center line and covering the component connecting portion, and the protective cover movable between an open position wherein the opening is uncovered and a projection of the protective cover is connected to an upper case by a U shape connecting member and a close position wherein the opening is covered; the protective cover having a first end proximal to the rotation center line and a second end opposite to the first end and comprising a pair of hooks on the second end, the hooks having specific portions projecting outwardly in respective directions which are parallel to the rotation center line and reverse to each other; and two flanges formed in the outer wall, each flange supporting a respective portion of the second end of the cover, and a pair of hook receivers formed in the outer wall adjacent the opening and within a thickness of a portion of the outer wall adjacent to the opening, the hook receivers are located below respective ones of the flanges and the hooks are elastically bendable so that they can move towards one another as they are moved over convex portions of respective flanges into their respective receivers holes, the protective cover abutting the flanges and the hooks engaging respective hook receivers when the protective cover is in its closed position to hold the protective cover in place.

2. An electronic device as claimed in claim 1, wherein the case includes an upper case and a lower case coupled with the upper case, the protective cover and the hook receiver being disposed on the upper case.

3. An electronic device as claimed in claim 1, wherein the case includes an upper case and a lower case coupled with the upper case, the protective cover being disposed on the upper case, the hook receiver being disposed on the lower case.

4. An electronic device as claimed in claim 1, further including a panel arranged inside the case, the component connecting portion being mounted on the panel.

5. An electronic device as claimed in claim 1, wherein the case has an edge portion formed on its upper surface and defining a cover receiving opening, the protective cover being mounted so as to be fitted to the cover receiving opening.

6. An electronic device as claimed in claim 1, wherein the case has a flange on which the protective cover is supported when the protective cover is moved into a closed position.

7. An electronic device as claimed in claim 1, wherein the component connecting portion is a connector for connecting a memory card.

8. An electronic device as claimed in claim 1, wherein the component connecting portion is a connector for connecting an SIM card.

9. An electronic device as claimed in claim 1, wherein the component connecting portion is a contact point for connecting an exchangeable battery.

10. A casing for an electronic device, including a case having an outer wall having an opening and incorporating a component connecting portion and a protective cover mounted to the case to be rotatable around a rotation center line and covering the component connecting portion, the protective cover having a first end proximal to the rotation center line and a second end opposite to the first end and comprising a pair of hooks on the second end, the hooks having specific portions projecting outwardly in respective directions which are parallel to the rotation center line and reverse to each other; the protective cover movable between an open position wherein the opening is uncovered and a projection of the protective cover is connected to an upper case by a U shape connecting member and a close position wherein the opening is covered; and two flanges formed in the outer wall, each flange supporting a respective portion of the second end of the cover, and a pair of hook receivers formed in the outer wall adjacent the opening and within a thickness of a portion of the outer wall adjacent to the opening, the hook receivers are located below respective ones of the flanges and the hooks are elastically bendable so that they can move towards one another as they are moved over convex portions of respective flanges into their respective receivers holes, the protective cover abutting the flanges and the hooks engaging respective hook receivers when the protective cover is in its closed position to hold the protective cover in place.

11. A casing for an electronic device as claimed in claim 10, wherein the case includes an upper case and a lower case coupled with the upper case, the protective cover and the hook receiver being disposed on the upper case.

12. A casing for an electronic device as claimed in claim 10, wherein the case includes an upper case and a lower case coupled with the upper case, the protective cover being disposed on the upper case, the hook receiver being disposed on the lower case.

13. A casing for an electronic device as claimed in claim 10, further including a panel arranged inside the case, the component connecting portion being mounted on the panel.

14. A casing for an electronic device as claimed in claim 10, wherein the case has an edge portion formed on its upper surface and defining a cover receiving opening, the protective cover being mounted so as to be fitted to the cover receiving opening.

15. A casing for an electronic device as claimed in claim 10, wherein the case has a flange on which the protective cover being is supported by the flange when the protective cover is moved into a closed position.

16. A casing for an electronic device as claimed in claim 10, wherein the component connecting portion is a connector for connecting a memory card.

17. A casing for an electronic device as claimed in claim 10, wherein the component connecting portion is a connector for connecting an SIM card.

18. A casing for an electronic device as claimed in claim 10, wherein the component connecting portion is a contact point for connecting an exchangeable battery.

19. An electronic device including a case having an outer wall having an opening, a component connecting portion mounted inside the case, and a protective cover mounted to the case to be rotatable around a rotation center line and covering the component connecting portion, the protective cover having a first end proximal to the rotation center line and a second end opposite to the first end and comprising a hook on the second end, the hook having a specific portion which projects in a particular direction parallel to the rotation center line, the case having a hook receiver which is engageable with the hook, the hook being elastically deformable in the particular direction, the specific portion being engaged with the hook receiver and disengageable from the hook receiver with the hook being elastically deformed in the particular direction; the protective cover movable between an open position wherein the opening is uncovered and a projection of the protective cover is connected to an upper case by a U shape connecting member and a close position wherein the opening is covered; and two flanges formed in the outer wall, each flange supporting a respective portion of the second end of the cover, and a pair of hook receivers formed in the outer wall adjacent the opening and within a thickness of a portion of the outer wall adjacent to the opening, the hook receivers are located below respective ones of the flanges and the hooks are elastically bendable so that they can move towards one another as they are moved over convex portions of respective flanges into their respective receivers holes, the protective cover abutting the flanges and the hooks engaging respective hook receivers when the protective cover is in its closed position to hold the protective cover in place.

20. An electronic device as claimed in claim 19, wherein the end portion of the protective cover is apart from the rotation center line and provided with the hook.

21. An electronic device, comprising: a case housing electronic components and a connector connected to at least one of the electronic components, the case having an outer wall having an opening which, when uncovered, allows access to the connector, a portion of the outer wall located is adjacent the opening having a thickness; a protective cover movable between an open position wherein the opening is uncovered and a projection of the protective cover is connected to an upper case by a U shape connecting member and a closed position wherein the opening is covered, the protective cover having a first end about which the cover rotates around a rotation axis when it is being moved between the open and closed positions and a second end which is distal from the first end, a pair of hooks protruding from the protective cover in opposite directions parallel to the rotation axis; and two flanges formed in the outer wall, each flange supporting a respective portion of the protective cover, and a pair of hook receivers formed in the outer wall adjacent the opening and within the thickness of the portion of the outer wall adjacent to the opening, the hook receivers are located below respective ones of the flanges and the hooks are elastically bendable so that they can move towards one another as they are moved over convex portions of respective flanges into their respective receivers holes, the protective cover abutting the flanges and the hooks engaging respective hook receivers when the protective cover is in its closed position to hold the protective cover in place.

22. The electronic device of claim 21, wherein the flange supports the protective cover in a position wherein an outer surface of the protective cover is aligned with an outer surface of the outer wall adjacent the opening.

23. An electronic device as claimed in claim 21, wherein the case includes an upper case and a lower case coupled with the upper case, the protective cover and the hook receiver being disposed on the upper case.

24. An electronic device as claimed in claim 21, wherein the case includes an upper case and a lower case coupled with the upper case, the protective cover being disposed on the upper case, the hook receivers being disposed on the lower case.

25. An electronic device as claimed in claim 21, further including a panel arranged inside the case, the connector is mounted on the panel.

26. An electronic device as claimed in claim 21, wherein the connector is adapted to receive a memory card.

27. An electronic device as claimed in claim 21, wherein the connector is adapted to receive a SIM card.

28. An electronic device as claimed in claim 21, wherein the connector is adapted to receive an exchangeable battery.

* * * * *